United States Patent
Wu (10) Patent No.: US 6,605,840 B1
(45) Date of Patent: Aug. 12, 2003

(54) SCALABLE MULTI-BIT FLASH MEMORY CELL AND ITS MEMORY ARRAY

(76) Inventor: Ching-Yuan Wu, 1F, No.23, R&D Rd.1, Science-Based Industrial Park, Hsinchu (TW)

( * ) Notice: Subject to any disclaimer, the term of this patent is extended or adjusted under 35 U.S.C. 154(b) by 0 days.

(21) Appl. No.: 10/067,600

(22) Filed: Feb. 7, 2002

(51) Int. Cl.[7] ............................................... H01L 29/72
(52) U.S. Cl. .................... 257/315; 257/51; 257/316; 257/321; 257/322; 257/335; 257/336
(58) Field of Search .................. 257/315, 51, 316, 257/321, 322, 335, 336

(56) References Cited

U.S. PATENT DOCUMENTS

| | | | |
|---|---|---|---|
| 5,364,806 A | 11/1994 | Ma et al. ....................... | 437/43 |
| 5,654,917 A | 8/1997 | Ogura et al. ............ | 365/185.18 |
| 5,989,960 A | 11/1999 | Fukase ........................ | 438/267 |
| 6,051,860 A | 4/2000 | Odanaka et al. ............. | 257/316 |
| 6,133,098 A | 10/2000 | Ogura et al. ................ | 438/267 |
| 6,248,633 B1 | 6/2001 | Ogura et al. ................ | 438/267 |
| 2002/0109138 A1 * | 8/2002 | Forbes ......................... | 257/51 |

OTHER PUBLICATIONS

S. Aritome, "Advanced flash Memory Technology and Trends for File Storage Application," IEDM (2000), pp. 763–766.

J.D. Choi et al., "A 0.15 um NAND flash technology with 0.1 um2 cell Size for 1G bit Flash Memory," IEDM (2000), pp. 767–700.

* cited by examiner

Primary Examiner—Edward Wojciechowicz
(74) Attorney, Agent, or Firm—Dickinson Wright PLLC (57) ABSTRACT

The scalable multi-bit flash memory cell includes three regions: the first-side region, the gate region, and the second-side region, in which the gate region includes two stack-gate transistors and one select-gate transistor. The first-side/second-side region comprises a sidewall-oxide spacer formed over the gate region and from top to bottom comprises a planarized thick-oxide layer, a silicided conductive layer formed on a flat bed, and a common-diffusion region. The stack-gate transistor comprises from top to bottom a sidewall dielectric spacer, an elongated control-gate layer formed over an intergate dielectric layer, and an integrated floating-gate layer. The select-gate transistor comprises a planarized conductive island formed over a gate-dielectric layer and is connected to a word line. A plurality of scalable multi-bit flash memory cells are alternately arranged to form a scalable multi-bit flash memory cell array.

20 Claims, 11 Drawing Sheets

SCALABLE MULTI-BIT FLASH MEMORY CELL AND ITS MEMORY ARRAY

BACKGROUND OF THE INVENTION

1. Field of the Invention

The present invention relates in general to a flash memory cell and its memory cell array and, more particularly, to a scalable multi-bit flash memory cell and its memory cell array.

2. Description of the Related Art

Basically, flash memory devices can be divided into two categories: a stack-gate structure and a split-gate structure. The stack-gate structure is known to be a one-transistor cell, in which the gate length of a cell can be defined by using the minimum-feature-size (F) of technology used. However, the split-gate structure including a floating-gate and a select gate is known to be a 1.5-transistor cell. Therefore, the stack-gate structure is often used in a high-density flash memory system. The stack-gate structure can be connected in series to form a high-density NAND-type array with common source/drain diffusion regions. However, the access speed is slow in an NAND-type flash memory array due to the series resistance of the configuration. Moreover, an NAND-type flash memory array is programmed by Fowler-Nordheim tunneling which is a relatively slow process. The split-gate structure having a select gate used to prevent the over-erasing problem is in general configured to form a NOR-type array and the hot-electron injection is used to obtain high-speed programming. As a consequence, a flash memory cell taking the advantages of stack-gate and split-gate structures is a major trend for development, and a typical example is shown in FIG. 1 as disclosed by U.S. Pat. No. 5,364,806.

Figure 1A:
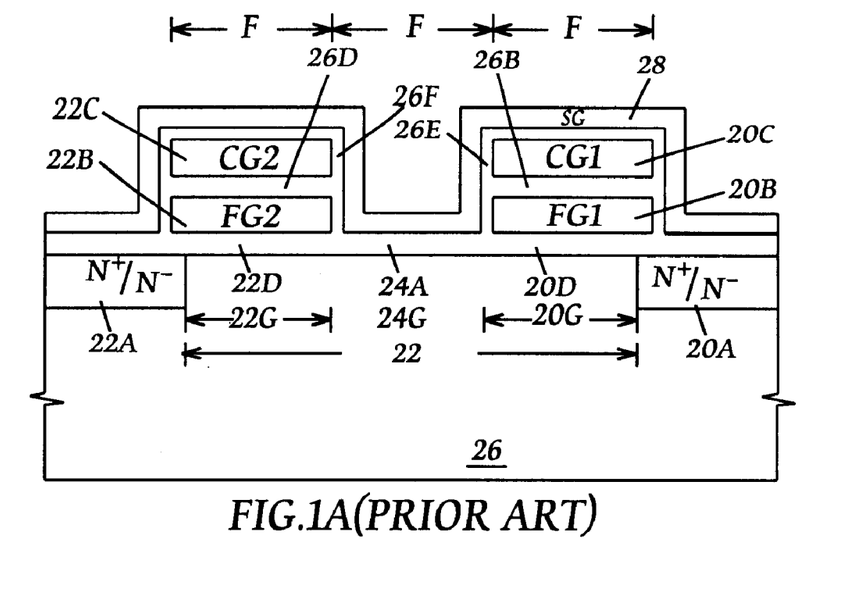
FIG. 1A shows a cross-sectional view of a multi-bit flash memory cell and FIG. 1B shows a top plan view of a multi-bit flash memory cell.
Figure 1B:
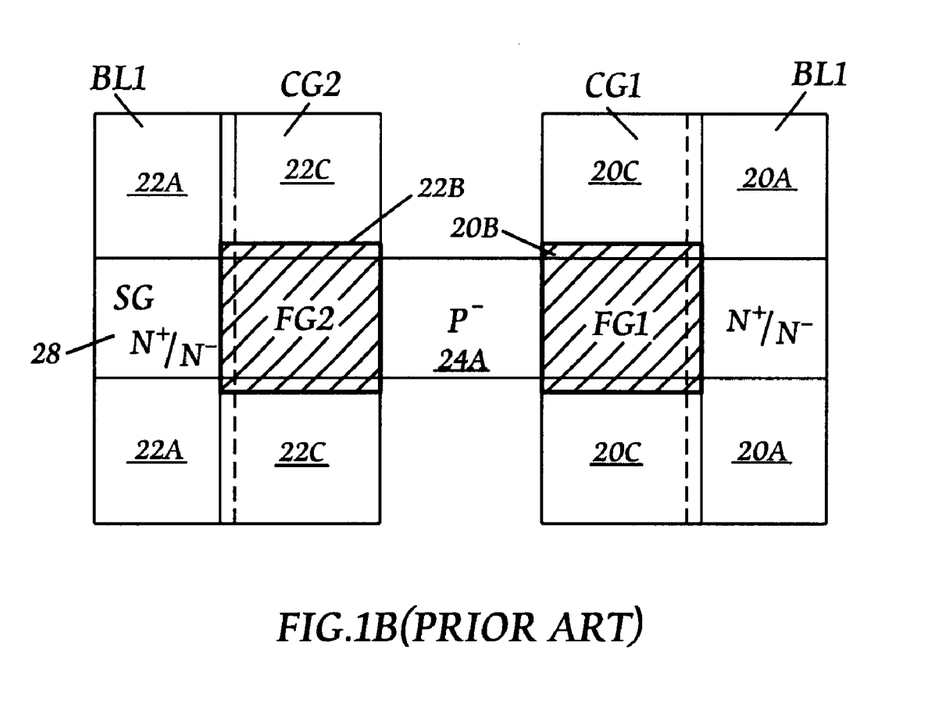

Referring to FIG. 1A, two stack-gate structures 20G, 22G are separated by a select gate 24G and two common N+/N− diffusion lines 20A, 22A acting as the bit lines are formed in each side of the stack-gate structure. A top plan view of FIG. 1A is shown in FIG. 1B, in which a third poly-silicon layer 28 acting as a select gate is formed above the common N+/N− diffusion lines 20A, 22A and the control-gate lines 20C, 22C. From FIG. 1A and FIG. 1B, four masking steps are required to implement the device and the cell size of each bit is limited to $4F^2$, which is equivalent to that of an NAND-type array using the stack-gate structure. However, there are several drawbacks as compared to existing NAND-type array: very high parasitic capacitances between the select-gate (word) line and the bit line; very high parasitic capacitances between the select-gate (word) line and the control-gate line; the isolation between the cells in the nearby word lines is poor; and the isolation between the nearby bit lines and the nearby word lines is weak. More seriously, a poor isolation between the word lines may result in an erroneous data in reading for a selected cell.

It is therefore an objective of the present invention to provide a multi-bit cell having a cell size of each bit being smaller than $4F^2$ and scalable.

It is another objective of the present invention to provide a shallow-trench-isolation structure for a high-density multi-bit flash memory array.

It is further objective of the present invention to provide a better density·speed·power product for a multi-bit flash memory array.

Other objectives and advantages of the present invention will be apparent from the following description.

SUMMARY OF THE INVENTION

The scalable multi-bit flash memory cell and its memory array are disclosed by the present invention. The scalable multi-bit flash memory cell of the present invention is divided into three regions: the first-side region, the gate region, and the second-side region, in which the gate region is defined by a masking photoresist step and is therefore scalable. The gate region includes two stack-gate transistors being formed in each side portion of the gate region and one select-gate transistor being formed between two stack-gate transistors. The first-side/second-side region comprises a sidewall-oxide spacer being formed over the sidewalls of the gate region and on a portion of a flat bed and outside of a sidewall-oxide spacer comprises from top to bottom a planarized thick-oxide layer, a silicide layer, and a conductive layer formed over a portion of a flat bed. The flat bed is formed by a common-diffusion region and two etched raised field-oxide layers formed nearby and each of two stack-gate transistors comprises from top to bottom a sidewall dielectric spacer, an elongated control-gate layer formed over an intergate dielectric layer, and an integrated floating-gate layer, wherein the integrated floating-gate layer comprises a major floating-gate layer being formed over a thin tunneling-dielectric layer and two extended floating-gate layers being separately formed on a portion of each of raised field-oxide layers formed nearby. A gate-dielectric layer is formed over the planarized thick-oxide layers, two stack-gate transistors and their inner sidewalls, and a semiconductor surface between two stack-gate transistors. A planarized conductive island being patterned and etched simultaneously with a word line is formed over the gate-dielectric layer between two stack-gate transistors, wherein an implanted region is formed in the semiconductor substrate under the select-gate region with a shallow implant for threshold-voltage adjustment and a deep implant for forming a punch-through stop. The word line comprises a metal layer being formed over the gate-dielectric layer and a planarized conductive island being formed between two stack-gate transistors, and a hard masking layer including a masking dielectric layer and its two sidewall spacers being formed over the metal layer to simultaneously pattern and etch the metal layer and the planarized conductive island.

A plurality of scalable multi-bit flash memory cells of the present invention are arranged to form a scalable flash memory cell array of the present invention. A plurality of parallel shallow-trench-isolation (STI) regions are formed on a semiconductor substrate having a plurality of active regions formed therebetween, wherein each of the plurality of parallel STI regions comprises a raised field-oxide layer and each of the plurality of active regions comprises a thin tunneling dielectric layer being formed on the semiconductor substrate. A plurality of gate regions are formed over the semiconductor substrate and transversely to the plurality of parallel STI regions and a plurality of common bit-line regions are formed therebetween. Each of the plurality of gate regions includes two stack-gate regions being separately formed in each side portion and one select-gate region being formed between two stack-gate regions. Each of two stack-gate regions comprises from top to bottom a sidewall dielectric spacer, an elongated control-gate layer formed over an intergate dielectric layer, and a plurality of integrated floating-gate layers. Each of the plurality of integrated floating-gate layers comprises a major floating-gate layer being formed over a thin tunneling-dielectric layer and two extended floating-gate layers being formed separately on a portion of each of raised field-oxide layers formed nearby. Each of the plurality of common bit-line regions comprises a pair of sidewall dielectric spacers being formed over the sidewalls of the plurality of gate regions and on a portion of a flat bed, and outside of the pair of sidewall dielectric spacers further comprises a planarized thick-oxide layer, a silicide layer, and a conductive layer formed on a flat bed. The flat bed is formed alternately by common-diffusion regions and etched raised field-oxide layers. A gate-dielectric layer is formed alternately over the planarized thick-oxide layers, stack-gate regions and their inner sidewalls, and a semiconductor surface of the select-gate region, and a plurality of planarized conductive islands are formed over the gate-dielectric layer between a pair of stack-gate regions in each of the plurality of gate regions. A plurality of word lines are formed above the plurality of active regions, wherein each of the plurality of word lines comprises a metal layer being formed over the gate-dielectric layer and the planarized conductive islands and a hard masking layer including a masking dielectric layer and its two sidewall dielectric spacers being formed over the metal layer to simultaneously pattern and etch the metal layer and the planarized conductive islands.

The scalable multi-bit flash memory cell and its memory array of the present invention may offer the following advantages and features: scalable cell size; a highly conductive bit line having lower bit-line capacitance and resistance; no contact problems for shallow diffusion junction; good isolation for memory cells; and better density·speed·power product as compared to the prior art.

BRIEF DESCRIPTION OF THE DRAWINGS

FIG. 1A and FIG. 1B show the schematic diagrams of the prior art, in which

FIG. 2A through FIG. 2C show the schematic diagrams of the present invention, in which

DETAILED DESCRIPTION OF THE PREFERRED EMBODIMENTS

Figure 2A:
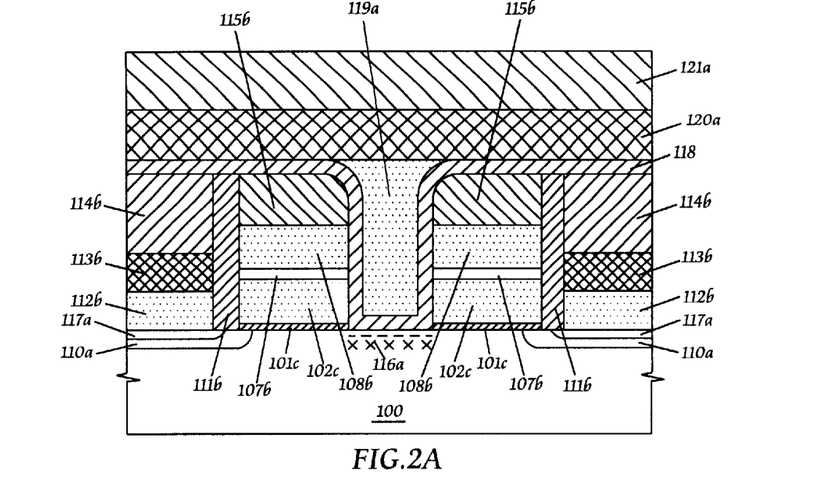
FIG. 2A shows a cross-sectional view of a scalable flash memory bit cell.

Referring now to FIG. 2A, there is shown a cross-sectional view of a scalable multi-bit flash memory cell of the present invention. As shown in FIG. 2A, the scalable multi-bit flash memory cell can be divided into three regions: the first-side region, the gate region, and the second-side region, in which the gate region being situated between the first-side region and the second-side region includes two stack-gate transistors formed separately on each side portion of the gate region and one select-gate transistor formed between two stack-gate transistors; the first-side region and the second-side region are the bit-line regions. Each of two stack-gate transistors comprises from top to bottom a sidewall dielectric spacer 115b, an elongated control-gate layer 108b, an intergate dielectric layer 107b, an integrated floating-gate layer, and a thin tunneling-dielectric layer 101c formed on the semiconductor substrate 100 of a first conductivity type. The first-side/second-side region comprises a sidewall-oxide spacer 111b formed over a sidewall of the gate region and comprises from top to bottom a planarized thick-oxide layer 114b, a silicide layer 113b, a conductive layer 112b formed over a flat bed. The flat bed is formed by a heavily-doped diffusion region 117a of a second conductivity type being formed within a lightly-doped diffusion region 110a of a second conductivity type and etched raised field-oxide layers 104c. The integrated floating-gate layer includes a major floating-gate layer 102c formed over a thin tunneling-dielectric layer 101c and two extended floating-gate layers 105c formed over a portion of each of raised field-oxide layers 104b formed nearby. A gate-dielectric layer 118 is formed over the planarized thick-oxide layers 114b, the stack-gate transistors and their inner sidewalls, and a semiconductor surface between two stack-gate transistors. A planarized conductive island 119a is formed over the gate-dielectric layer 118 between two stack-gate transistors and is patterned and etched simultaneously with a word line 120a using a hard masking layer formed by a masking dielectric layer 121a and its two sidewall dielectric spacers 122a. The semiconductor surface under the select-gate region is implanted to form an implanted region 116a with a shallow implant (dash lines) for threshold-voltage adjustment and a deep implant (cross symbols) for forming a punch-through stop.

Figure 2B:
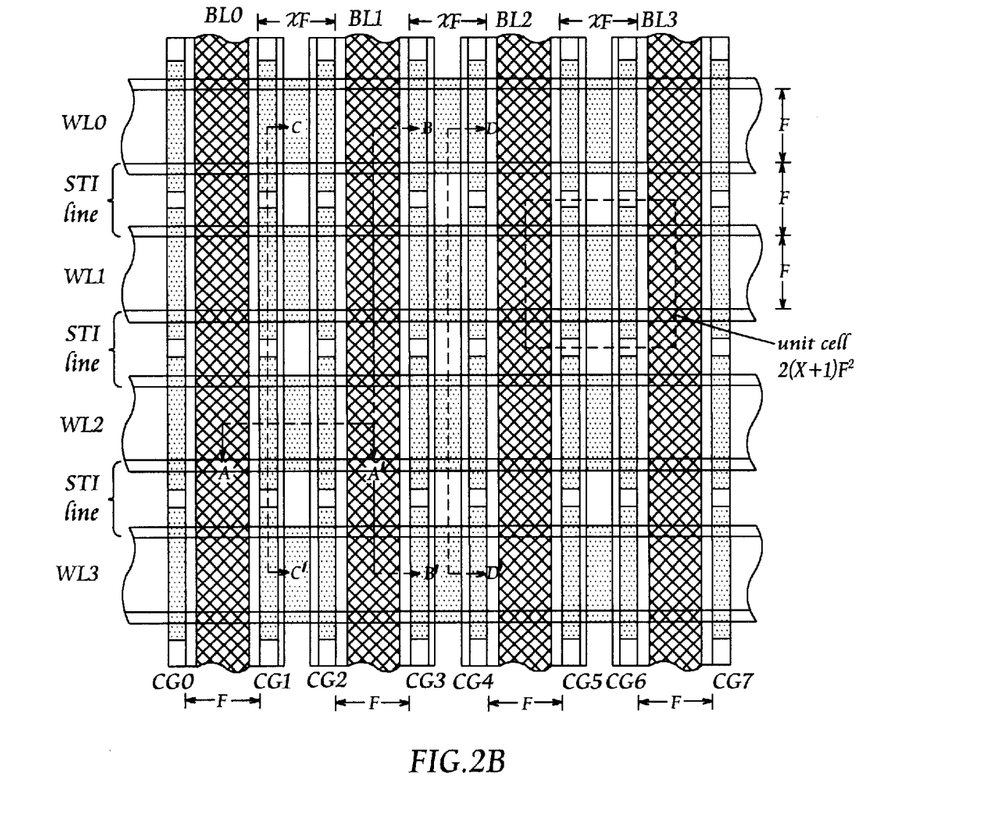
FIG. 2B shows a top plan view of a scalable multi-bit flash memory array of the present invention.

FIG. 2B shows a top plan view of a scalable multi-bit flash memory cell array of the present invention, in which a plurality of parallel shallow-trench-isolation (STI) regions are formed on a semiconductor substrate 100 of a first conductivity type with a plurality of active regions being formed therebetween; a plurality of gate regions as marked by XF are formed transversely to the plurality of parallel STI regions and are patterned by a masking photoresist step having a plurality of bit-line (BL) regions formed therebetween; a plurality of word lines (WL) are formed above the plurality of active regions and are located transversely to the plurality of bit-line regions. Each of the plurality of parallel STI regions comprises a raised field-oxide layer 104b being formed on the semiconductor substrate 100 and each of the plurality of active regions comprises a thin tunneling-dielectric layer 101a being formed over the semiconductor substrate 100. Each of the plurality of bit-line regions comprises a pair of sidewall dielectric spacers 111b formed over an opposite sidewall of the nearby gate regions and on a portion of a flat bed and from top to bottom comprises a planarized thick-oxide layer 114b, a silicide layer 113b, and a conductive layer 112b formed over a flat bed between a pair of sidewall dielectric spacers 111b. A plurality of common-diffusion regions of a second conductivity type being formed in the semiconductor substrate 100 of the plurality of active regions along each bit-line region and a flat bed being formed alternately by common-diffusion regions and etched raised field-oxide layer 104c. Each of the plurality of common-diffusion regions comprises a heavily-doped diffusion region 117a being formed within a lightly-doped diffusion region 110a. Each of the plurality of gate regions comprises two stack-gate regions being located in each side portion of the gate region and formed on the semiconductor substrate 100 and a select-gate region being located between two stack-gate regions. Each of two stack-gate regions comprises from top to bottom a sidewall dielectric spacer 115b, an elongated control-gate layer 108b formed over an intergate dielectric spacer 107b, and a plurality of integrated floating-gate layers. Each of the plurality of integrated floating-gate layers comprises a major floating-gate layer 102c being formed on a thin tunneling-dielectric layer 101c and two extended floating-gate layers 105c being separately formed on a portion of a pair of raised field-oxide layers 104b formed nearby. A gate-dielectric layer 118 is formed alternately over the planarized thick-oxide layers 114b, two stack-gate regions and their inner sidewalls, and a semiconductor surface between two stack-gate regions, wherein an implanted region 116a being formed in the semiconductor substrate 100 between two stack-gate regions comprises a shallow implant (dash line) for threshold-voltage adjustment and a deep implant for forming a punch-through stop. Each of the plurality of word lines comprises a metal layer formed over a gate-dielectric layer 118 and a plurality of planarized conductive islands 119a formed over the select-gate regions, wherein a hard masking layer including a masking dielectric layer 121a and its two sidewall dielectric spacers 112a is used to simultaneously pattern and etch the metal layer 120 and the planarized conductive islands 119a to form an integrated word line.

A cross-sectional view along A–A' direction shown in FIG. 2B is shown in FIG. 2A and FIG. 4I(a); a cross-sectional view along B–B' direction shown in FIG. 2B is shown in FIG. 4I(b); a cross-sectional view along C–C' direction shown in FIG. 2B is shown in FIG. 4I(c); and a cross-sectional view along D–D' direction shown in FIG. 2B is shown in FIG. 4I(d). From an unit cell as marked by the dash line, the cell area of a multi-bit flash memory cell is $2(1+X)F^2$, where X is a scale factor and can be controlled to be $1 \leq X < 3$. For X=2, the cell size of each bit is only $3F^2$ which is much smaller than the limiting cell size of $4F^2$ for an advanced NAND-type array or a multi-bit cell of the prior art.

According to the description as addressed, the multi-bit flash memory cell and its memory array of the present invention exhibit the following advantages and features:

(a) The multi-bit flash memory cell of the present invention offers a scalable cell size and the cell size of each bit can be made to be smaller than $4F^2$.

(b) The multi-bit flash memory cell of the present invention offers a self-aligned integrated floating-gate layer to largely increase the coupling ratio of the floating-gate as compared to the multi-bit flash memory cell of the prior art.

(c) The multi-bit flash memory cell array of the present invention offers a conductive bit line with a lower bit-line resistance, a lower bit-line capacitance, and a lower bit-line leakage current, as compared to the buried diffusion bit line of the prior art.

(d) The multi-bit flash memory cell array of the present invention offers a shallow-trench-isolation structure for multi-bit flash memory cells in different word lines (or select lines) to eliminate the erroneous data in reading.

(e) The multi-bit flash memory array of the present invention offers lower word-line resistance and capacitance as compared to the multi-bit memory array of the prior art.

(f) The multi-bit flash memory cell array of the present invention offers a much better density·speed·power product as compared to that of NAND-type arrays.

Figure 2C:
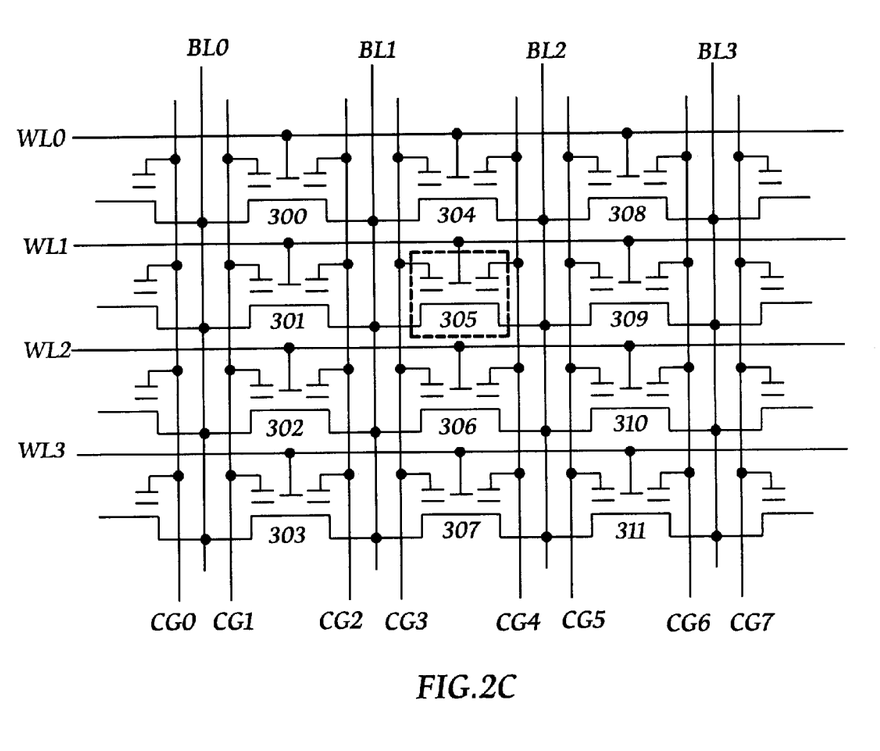
FIG. 2C shows a schematic circuit diagram of a scalable multi-bit flash memory array shown in FIG. 2B.

Referring now to FIG. 2C, there is shown a simplified circuit diagram for a multi-bit flash memory array shown in FIG. 2B. As shown in FIG. 2C, there are a plurality of bit-lines (BL0~BL3) and a plurality of elongated control-gate lines (CG0~CG7) being formed in parallel and a plurality of word lines (WL0~WL3) being formed transversely to the plurality of bit-lines with a plurality of select-gates of a plurality of multi-bit flash memory cells in a row being connected to a word line.

If a multi-bit flash memory cell 305 is to be programmed, a first voltage is applied to BL1 and a second voltage is applied to BL2; a first voltage is also applied to the bit lines in the same side of BL1 (for example BL0) and a second voltage is also applied to the bit lines in the same side of BL2 (for example BL3); a third voltage is applied to the control-gate lines CG3 and CG4; a fourth voltage is applied to the word line WL1. If the first voltage is 0 volts, the second voltage is 3~5 volts, the third voltage is 10~12 volts and the fourth voltage is slightly larger than the threshold voltage $V_T$ of the select-gate transistor, the stack-gate transistor near the bit-line BL2 will be programmed to a desired state by hot-electron-injection through a high lateral electric field across the gap between the select-gate and the stack-gate transistor near the bit-line BL2 if the fourth voltage is applied for a predetermined period of time. Similarly, if the first voltage is 3~5 volts, the second voltage is 0 voltage, the third voltage is 10~12 volts and the fourth voltage is slightly larger than the threshold voltage of the select-gate is applied for a predetermined period of time, the stack-gate transistor near the bit line BL1 will be programmed to a desired state. It is clear that each of stack-gate transistor can be programmed to a different desired state by controlling the period of time for a fourth voltage on the selected word line and the programming current is mainly controlled by a fourth voltage on the select-gate. Therefore, the programming efficiency is high and the programming power is less as compared to those of conventional channel-end hot-electron-injection.

For erasing, a first voltage of 10~12 volts is applied to BL1 and a third voltage of 0 volts is applied to the control-gate line CG3, the stack-gate transistors under the control-gate line CG3 can be erased by tunneling electrons from the floating-gates under the control-gate line CG3 into the bit line BL1. Similarly, a second voltage of 10~12 voltage is applied to BL2 and a third voltage of 0 volts is applied to CG4, the stack-gate transistors under the control-gate CG4 can be erased. Since the bit line is a common bit line for nearby cells in two columns, the stack-gate transistors near a bit line can be simultaneously erased if a first voltage of 10~12 volts is applied to the bit line and the third voltage of 0 volts is applied to the control-gate lines near the bit line. By the same way, all of the multi-bit flash memory cells can be simultaneously erased if all of the bit lines are applied with a voltage of 10~12 volts and all of the control-gate lines are applied with a voltage of 0 volts. It should be noted that no over-erasing problem may occur because the select-gate transistors are normally in the off state.

For a multi-bit flash memory cell 305 to be read, a first voltage of 0 volts is applied to the bit line BL1 and the bit lines in the same side of BL1 (for example BL0), a second voltage of 1.0~1.5v is applied to the bit line BL2 and the bit-lines in the same side of BL2, a third voltage of 5 volts is applied to the word line WL1, a fourth voltage of 10~12 volts is applied to CG4 and a fourth voltage of 5 volts is applied to CG3, then the state of stack-gate transistor under CG3 in a multi-bit flash memory cell 305 can be read; the state of another stack-gate transistor under CG4 in a multi-bit flash memory cell 305 can be read if a fourth voltage of 10~12 volts is applied to CG3 and a fourth voltage of 5 volts is applied to CG4. Similarly, the state of stack-gate transistor under CG4 can be read by reversing the applied voltage on the bit line BL1 and the bit line BL2, and a fourth voltage of 10~12 volts is applied to CG3 and a fourth voltage of 5 volts is applied to CG4.

It is clearly visualized that the operation voltages of a scalable multi-bit flash memory cell and its memory array are simple and the speed of programming, erasing and read is faster, as compared to those of a NAND-type flash memory array. As a consequence, a better density·speed·power product can be obtained by the scalable multi-bit flash memory cell and it memory array of the present invention.

Figure 3A:
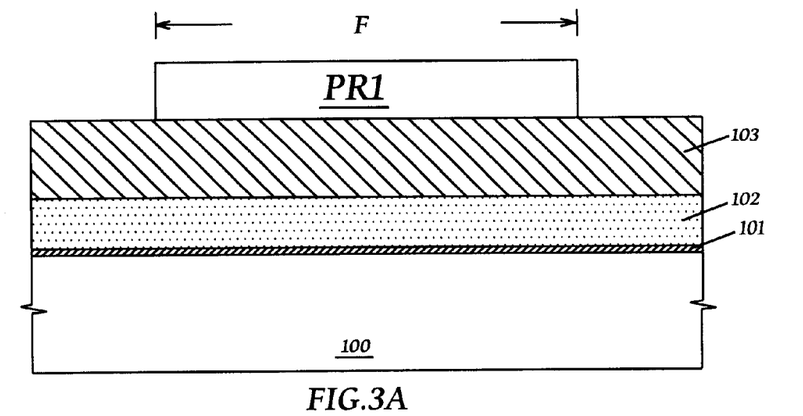
FIG. 3A through FIG. 3I show the process steps and their cross-sectional view for forming a shallow trench-isolation structure having the integrated floating-gate layers.

Referring now to FIG. 3A through FIG. 3I, there are shown the process steps and their cross-sectional views for fabricating a shallow-trench-isolation structure having an integrated floating-gate layer for a scalable multi-bit flash memory cell of the present invention. FIG. 3A shows that a thin tunneling-dielectric layer 101 is formed over a semiconductor substrate 100, a first conductive layer 102 is formed over the thin tunneling-dielectric layer 101, a first masking dielectric layer 103 is formed over the first conductivity layer 102, and the patterned photoresist PR1 are formed over the first masking dielectric layer 103 to define a plurality of active regions (under PR1) and a plurality of parallel shallow-trench-isolation (ST1) regions (between PR1). The thin tunneling-dielectric layer 101 is preferably a thermal-oxide layer or a nitrided thermal-oxide layer having a thickness between 60 Angstroms and 150 Angstroms. The first conductive layer 102 is preferably a doped polycrystalline-silicon layer or a doped amorphous-silicon layer having a thickness between 1000 Angstroms and 3000 Angstroms, as deposited by low-pressure chemical-vapor-deposition (LPCVD). The first masking dielectric layer 103 is preferably made of silicon-nitrides having a thickness between 1000 Angstroms and 5000 Angstroms, as deposited by LPCVD. It should be noted that FIG. 3A shows only a small portion of a memory array and in fact a plurality of patterned photoresist PR1 are formed to define a plurality of active regions and a plurality of parallel STI regions. The width and the space of the patterned photoresist PR1 can be defined to be a minimum feature size F as shown in FIG. 3A.

Figure 3B:
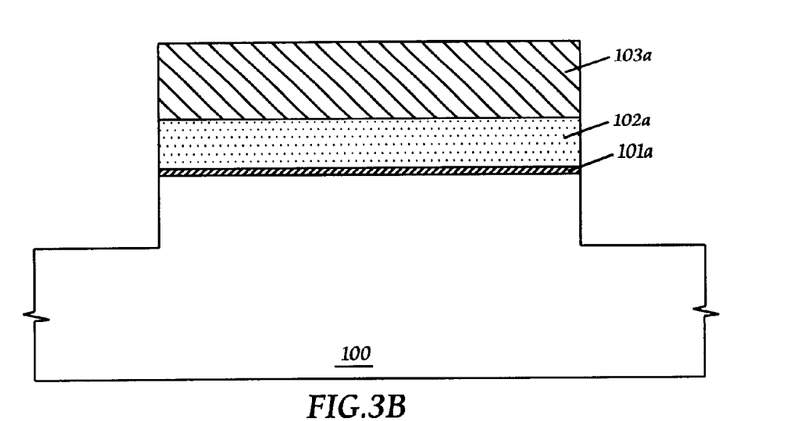

FIG. 3B shows that the first masking dielectric layer 103, the first conductive layer 102, the thin tunneling-dielectric layer 101, and the semiconductor substrate 100 are anisotropically etched to form the shallow trenches, and the patterned photoresist PR1 are then stripped. The depth of the shallow trenches formed in the semiconductor substrate 100 is preferably between 3000 Angstroms and 8000 Angstroms.

Figure 3C:
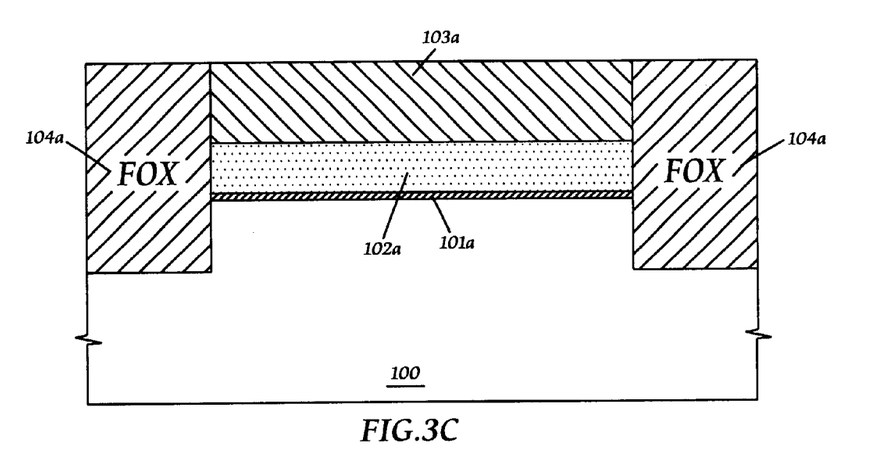

FIG. 3C shows that the planarized field-oxide (FOX) layers 104a are formed over the gaps being formed by the etching process shown in FIG. 3B. The planarized field-oxide layers 104a are formed by first depositing a thick-oxide film 104 using CVD or high-density plasma (HDP) CVD to fill up the gaps and then planarizing the deposited thick-oxide film 104 using chemical-mechanical-polishing (CMP) with the first masking dielectric layer 103a as a polishing stop. It should be noted that the shallow-trench surface can be oxidized first to eliminate the defects produced by the shallow-trench etching and the thick-oxide film 104 is then deposited.

Figure 3D:
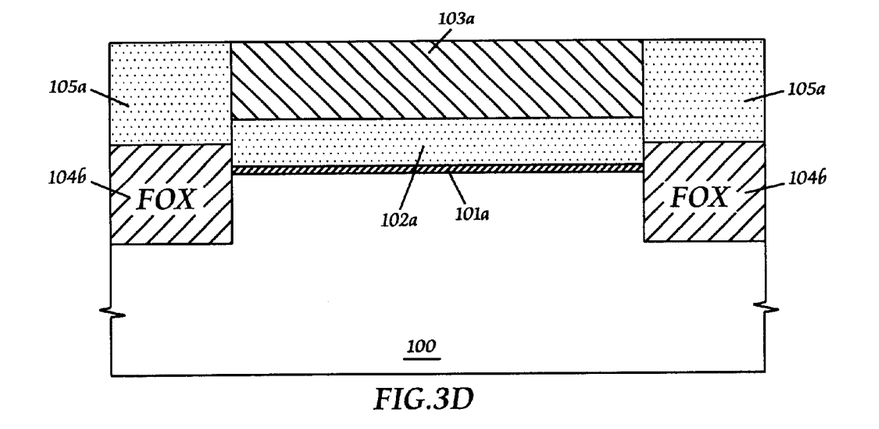

FIG. 3D shows that the planarized field-oxide layers 104a are etched back to a level being approximately equal to a half thickness of the first conductive layer 102a and then the planarized second conductive layers 105a are formed over the gaps produced by the etched-back planarized field-oxide layers 104b. The planarized second conductive layers 105a are formed by first depositing a thick second conductive film 105 to fill up the gaps and then planarizing the deposited thick second conductive film using CMP with the first masking dielectric layer 103a as a polishing stop. The planarized second conductive layer 105a is preferably made of doped polycrystalline-silicon or doped amorphous-silicon, as deposited by LPCVD.

Figure 3E:
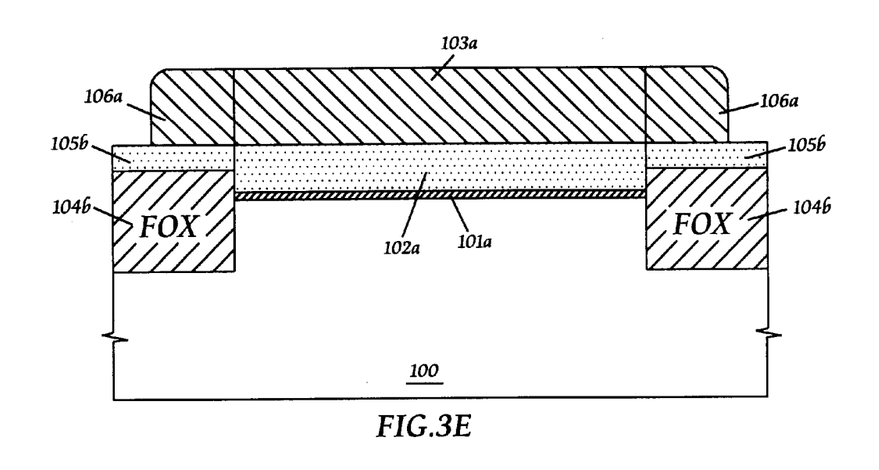

FIG. 3E shows that the planarized second conductive layers 105a are etched back to a thickness being approximately equal to the thickness of the first masking dielectric layer 103a and a first dielectric spacer 106a is then formed over the sidewalls of the first masking dielectric layer 103a and on the etched-back second conductive layers 105b. The first dielectric spacer 106a is formed by depositing a conformal dielectric layer 106 over the structure and then etching back anisotropically a thickness of the deposited conformal dielectric layer 106. The first dielectric spacer 106a is preferably made of silicon-nitrides as deposited by LPCVD. Note that the spacer width of the first dielectric spacer 106a can be controlled by the thickness of the deposited conformal dielectric layer 106.

Figure 3F:
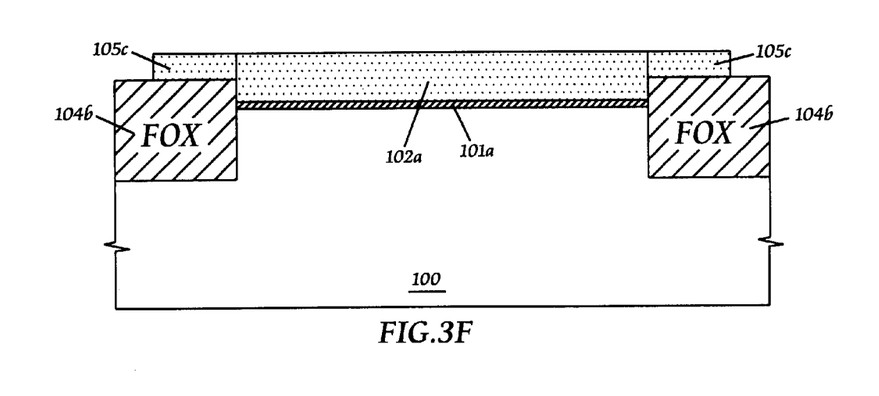

FIG. 3F shows that the etched-back second conductive layers 105b are etched by using the first dielectric spacers 106a and the first masking dielectric layers 103a as an etching mask to form an extended second conductive layers 105c, then the first dielectric spacers 106a and the first masking dielectric layers 103a are removed preferably by hot-phosphoric acid.

Figure 3G:
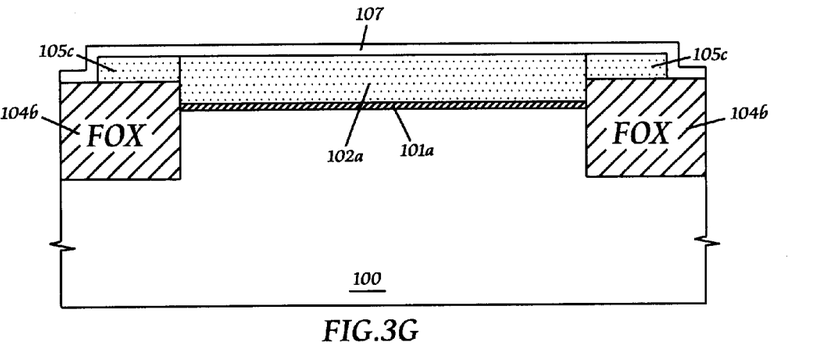

FIG. 3G shows that an intergate dielectric layer 107 is formed over the first conductive layers 102a, the extended second conductive layers 105c, and the raised field-oxide layers 104b. The intergate dielectric layer 107 is preferably a composite dielectric layer of an oxide-nitride-oxide (ONO) structure or a nitride-oxide structure and its equivalent oxide thickness is between 80 Angstroms and 150 Angstroms.

Figure 3H:
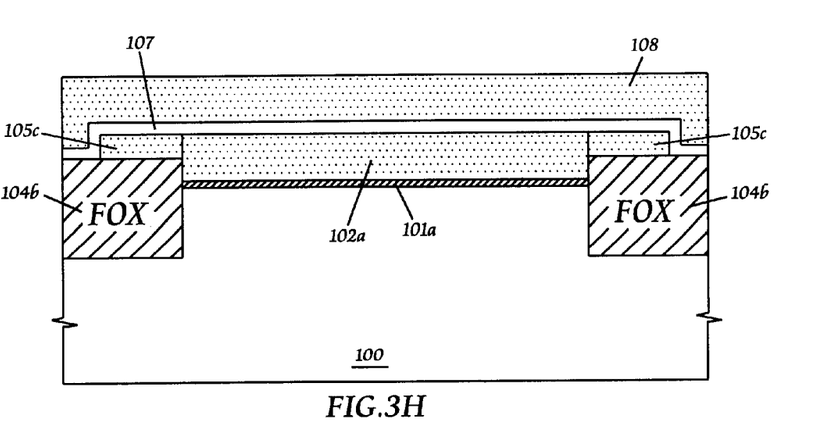
Figure 3I:
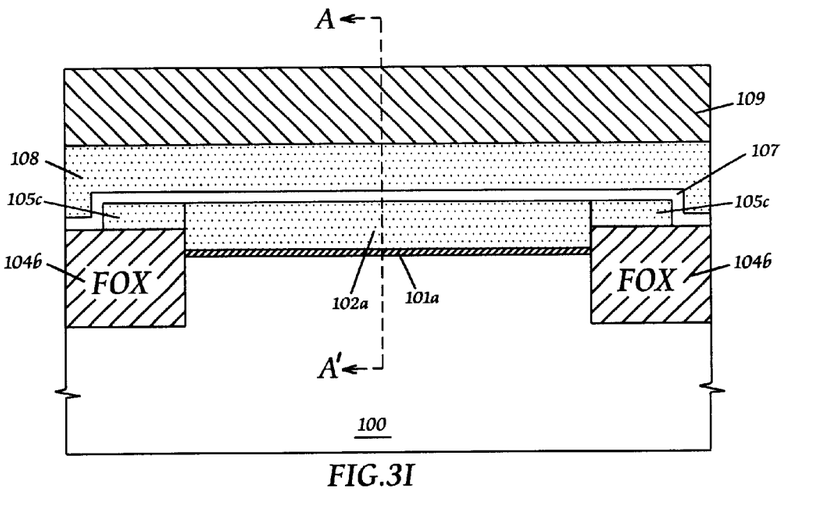

FIG. 3H shows that a third conductive layer 108 is formed over the intergate dielectric layer 107. The third conductive layer 108 is preferably a composite conductive layer of a polycide structure such as a tungsten-silicide ($WSi_2$) layer over a doped polycrystalline-silicon layer. The thickness of the polycide structure is preferably between 3000 Angstroms and 6000 Angstroms. The second masking dielectric layer 109 is then formed over the third conductive layer, as shown in FIG. 3I. The second masking dielectric layer 109 is preferably a silicon-nitride layer as deposited by LPCVD and it thickness is preferably between 1000 Angstroms and 5000 Angstroms. It should be noted that the third conductive layer 108 can be a doped polycrystalline-silicon layer or a barrier-metal layer formed between two doped polycrystalline-silicon layers and is silicided later. It is clearly seen from FIG. 3I that the integrated conductive layer including a first conductive layer 102a and two extended second conductive layers 105c may largely increase the coupling ratio of the floating-gate and the formed surface is quite flat for fine-line lithography. Moreover, the extended second conductive layers 105c are formed by the sidewall spacer technique and there is no additional masking step required. Therefore, the isolation region can be defined by a minimum-feature-size F.

Figure 4A:
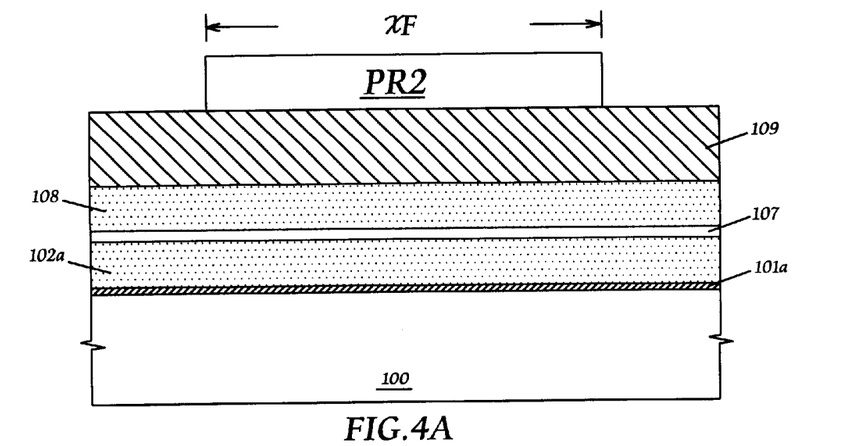
FIG. 4A through FIG. 4I show the process steps and their cross-sectional views for forming a scalable multi-bit flash memory cell and its memory array.

A cross-sectional view along A–A' direction in FIG. 3I is shown in FIG. 4A. As shown in FIG. 4A, the patterned photoresist PR2 are formed over the second masking dielectric layer 109 to define a plurality of gate regions (under PR2) and the width of a gate region including two stack-gate transistors and a select-gate transistor is marked by XF, where X can be a value larger than or equal to unity and is a scale factor. The regions outside of the gate region (not covered by PR2) are the common diffusion regions and can be defined to be F for each region.

Figure 4B:
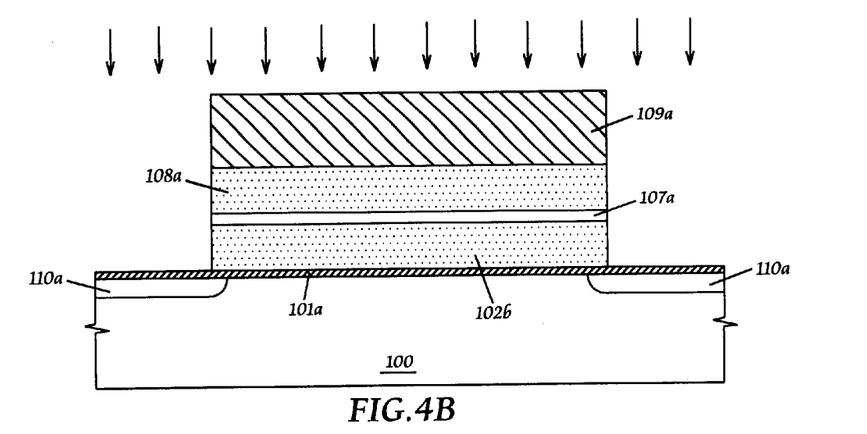

FIG. 4B shows that the second masking dielectric layer 109, the third conductive layer 108, the intergate dielectric layer 107 outside of the gate regions are selectively etched and removed in a self-aligned manner, a part of the first conductive layer 102a is selectively etched and the extended second conductive layers 105c over the raised field-oxide layers 104b (as shown in FIG. 3I) are removed, the raised field-oxide layers 104b are then selectively etched back to a depth approximately equal to the top level of the thin tunneling-dielectric layer 101a and, subsequently, the remained first conductivity layer is selectively removed and then the patterned masking photoresist PR2 are stripped. Ion-implantation is performed across the thin tunneling-dielectric layer 101a in a self-aligned manner to form the lightly-doped diffusion regions 110a in the semiconductor substrate 100, as shown in FIG. 4B. The implanted doping impurities are preferably phosphorous impurities for a p-type semiconductor substrate. Similarly, the boron impurities are preferably for an n-type semiconductor substrate. In the following process steps, the case of a p-type semiconductor substrate is described and that of an n-type semiconductor substrate can be treated by a well-known fashion.

Figure 4C:
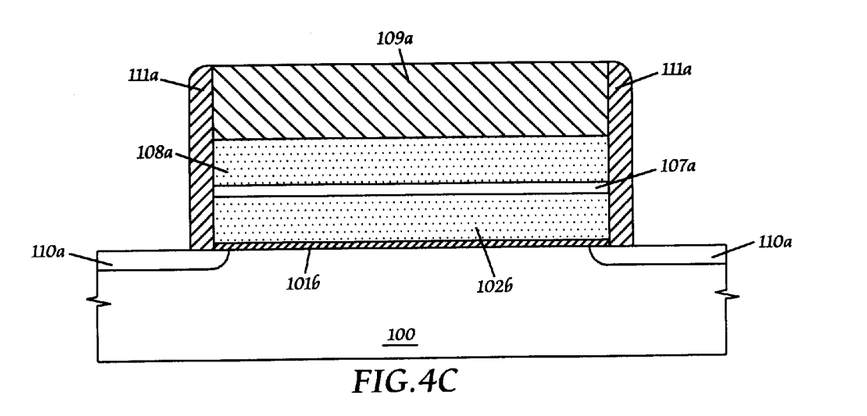

FIG. 4C shows that the thin tunneling-dielectric layers 101a outside of the gate region are removed and the etched raised field-oxide layers are further etched by dipping in a dilute hydroflouric acid to form a plurality of flat beds with each flat bed being alternately formed by the lightly-doped diffusion regions 110a and the etched raised field-oxide layers 104c, as will be shown later. The second dielectric spacers 111a are formed over the sidewalls of the gate regions and on a portion of the flat beds. The second dielectric spacer 111a is preferably a silicon-oxide layer deposited by LPCVD and its spacer width is preferably between 200 Angstroms to 2000 Angstroms.

Figure 4D:
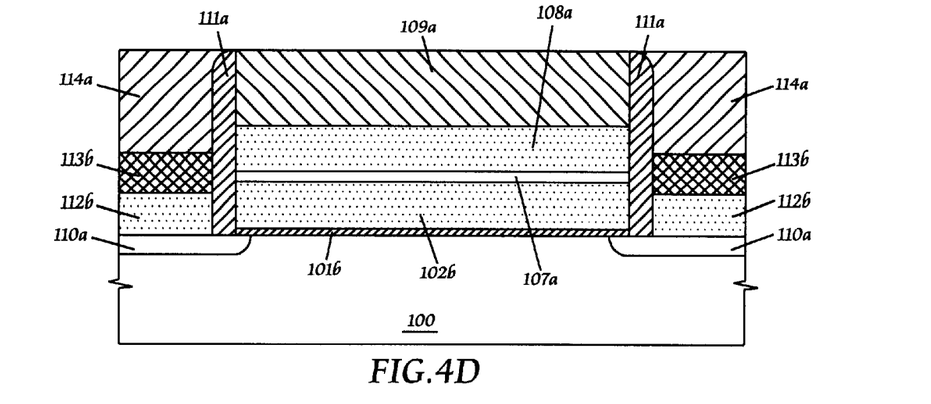

FIG. 4D shows that the planarized fourth conductive layer 112a (not shown) is formed over a flat bed between a pair of second dielectric spacers 111a and is etched back to a level approximately equal to the top surface of the first conductive layer 102b to form a conductive bus line 112b and a first silicide layer 113b is then formed over the conductive bus line 112b and, subsequently, a planarized thick-oxide layer 114a is formed over the first silicide layer 113b. The planarized fourth conductive layer 112a is formed by first depositing a thick fourth conductive layer 112 over the gap formed between a pair of second dielectric spacers and then planarizing the deposited thick fourth conductive layer 112 using CMP with a second masking dielectric layer 109a as a polishing stop. The thick fourth conductive layer 112 is preferably made of doped polycrystalline-silicon deposited by LPCVD and is heavily-implanted with phosphorous impurities after etching back to form a conductive bus line 112b. The first silicide layer 113b can be obtained by using either a well-known self-aligned silicidation technique or depositing a planarized thick first silicide layer and then etching back. The first silicide layer 113b is preferably made of refractory-metal silicides such as tungsten-silicides (WSi$_2$) or high melting-point silicides. The planarized first thick-oxide layer 114a is preferably made of CVD oxides or phosphosilicate glass (PSG) and is formed by first depositing a first thick-oxide layer 114 to fill up the gaps over the first silicide layer 113b and then planarizing the deposited first thick-oxide layer 114 using CMP with the second masking dielectric layer 109a as a polishing stop.

Figure 4E:
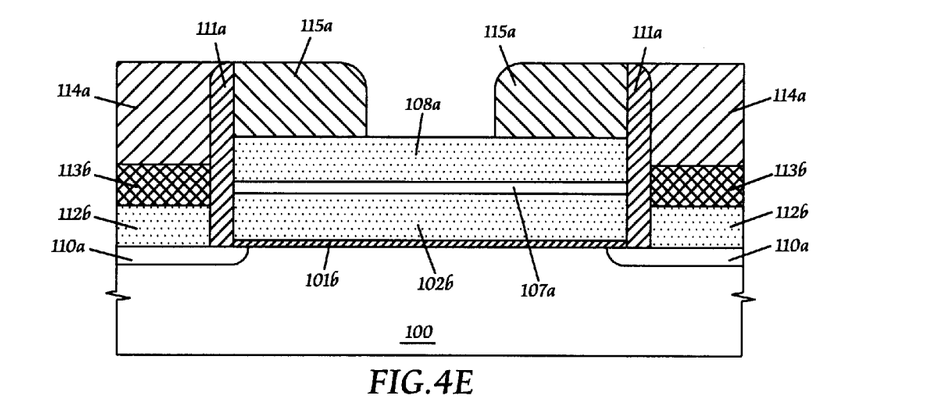

FIG. 4E shows that the second masking dielectric layer 109a is removed by using hot-phosphoric acid or anisotropic dry etching and two third dielectric spacers 115a are then formed over the inner sidewalls of each gate region. The third dielectric spacer 115a is preferably made of silicon-nitrides or silicon-oxides, as deposited by LPCVD. It should be noted that the spacer width of the third dielectric spacer 115a is used to control the gate length of two stack-gate transistors formed in a gate region.

Figure 4F:
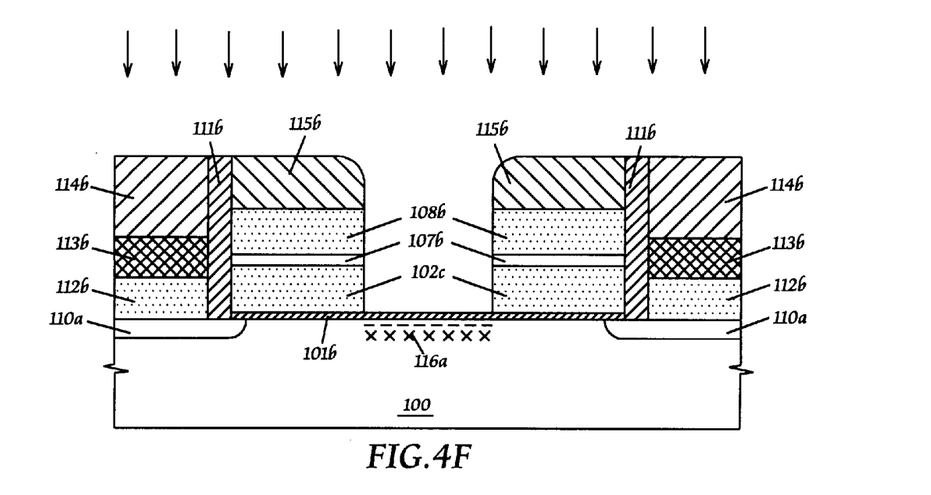

FIG. 4F shows that the third conductive layer 108a, the intergate dielectric layer 107a, and the first conductive layer 102b/the extended second conductive layer 105c outside of the third dielectric spacers 115b are selectively etched. Then, ion-implantation is performed across the thin tunneling-dielectric layer 101b in a self-aligned manner to form the implanted region 116a in the semiconductor substrate 100, which includes a shallow implant (dash lines) for threshold-voltage adjustment of the select-gate transistor and a deep implant (cross symbols) for forming a punch-through stop. The shallow implanted region is preferably formed by using boronflouride (BF$_2$) impurities and the deep implanted region is preferably formed by using boron impurities.

Figure 4G:
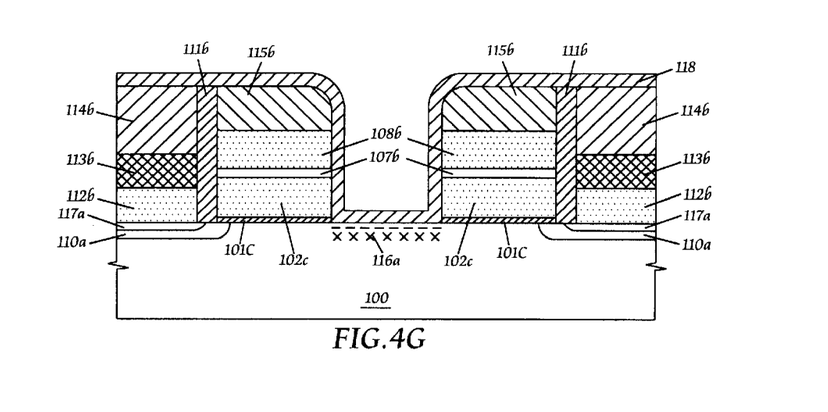

FIG. 4G shows that the thin tunneling-dielectric layer 101b between two stack-gate transistors is removed and the raised field-oxide layers 104b are simultaneously etched by dipping in a dilute hydroflouric-acid and a gate-dielectric layer 118 is formed over the structure. The gate-dielectric layer 118 is preferably an silicon-oxide layer deposited by high-temperature oxidation or a composite dielectric layer of a nitride-oxide structure or an oxide-nitride-oxide structure and its equivalent oxide thickness is preferably between 200 Angstroms and 500 Angstroms.

Figure 4H:
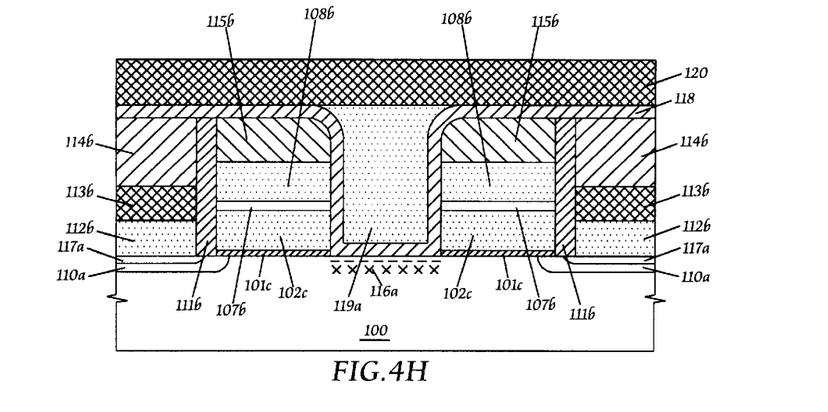
Figure 4I:
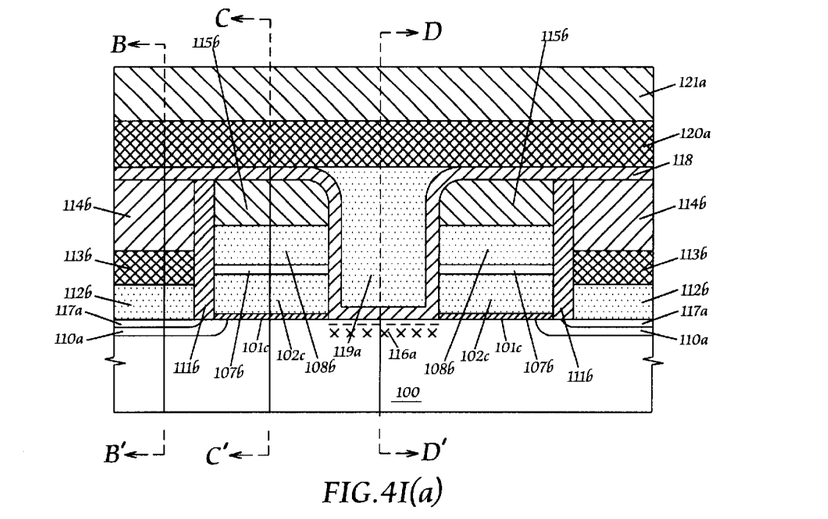

FIG. 4H shows that a fifth conductive layer 119 is deposited over the gate-dielectric layer 118 to fill up the gaps between two stack-gate transistors and the planarization is performed by using CMP. The fifth conductive layer 119 is preferably a doped polycrystalline-silicon layer or a first metal layer over a first barrier-metal layer. For a doped polycrystalline-silicon layer as the fifth conductive layer 119, the gate-dielectric layer 118 is preferably a nitride-oxide structure or an oxide-nitride-oxide structure and the planarized fifth conductive layer 119a is formed by using the silicon-nitride layer in the nitride-oxide structure or the oxide-nitride-oxide structure as a polishing stop; the planarized fifth conductive layer 119a can be further heavily implanted with phosphorous impurities (not shown) and a second silicide layer (not shown ) is then formed over the palanarized fifth conductive layer 119a using a well-known self-aligned silicidation process. The second silicide layer is preferably a refractory-metal silicide layer such as titanium-silicide (TiSi$_2$), cobalt-silicide (CoSi$_2$), tantalumsilicide (TaSi$_2$), nickel-silicide (NiSi$_2$), molybdenum-silicide (MoSi$_2$), platinum-silicide (PtSi$_2$) or tungsten-silicide (WSi$_2$) etc. A sixth conductive layer 120 is then formed over the gate-dielectric layer 118 and the planarized fifth conductive layers 119a, as shown in FIG. 4H. For a first metal layer over a first barrier-metal layer as the fifth conductive layer 119, the first metal layer is preferably made of tungsten (W) or tungsten-silicide (WSi$_2$) and the first barrier-metal layer is preferably made of refractory-metal nitrides such as titanium-nitrides (TiN) or tantalum-nitrides (TaN), and the planarized fifth conductive layer 119a is obtained by CMP with the gate-dielectric layer 118 as a polishing stop, The sixth conductive layer 120 is then formed over the gate-dielectric layer 118 and the planarized fifth conductive layer 119a as shown in FIG. 4H. The sixth conductive layer 120 for both cases is preferably made of a second metal layer formed over a second barrier-metal layer. The second metal layer is preferably made of aluminum (Al) or copper and the second barrier-metal layer is preferably made of refractory-metal nitrides such as titanium-nitrides and tantalum nitrides.

FIG. 4I(a) shows that a plurality of hard masking layers are formed over the sixth conductive layer 120 to form a plurality of word lines above the plurality of active-region lines and are further used as a mask to etch the sixth conductive layer 120 and the fifth conductive layers 119. The hard masking layer includes a third masking dielectric layer 121a and its two sidewall dielectric spacers 112a (as shown in FIG. 4I(b) through FIG. 4I(d)) and is preferably made of silicon-nitrides or silicon-oxides.

Referring now to FIG. 4I(b) through FIG. 4I(d), there are shown various cross-sectional views as indicated in FIG. 4I(a), in which FIG. 4I(b) shows a cross-sectional view along B–B' direction as indicated in FIG. 4I(a); FIG. 4I(c) shows a cross-sectional view along C–C' direction as indicated in FIG. 4I(a); and FIG. 4I(d) shows a cross-sectional view along D–D' direction. As shown in FIG. 4I(b), the bit line consisting of a thinner planarized fourth conductive layer 112b capped with a first silicide layer 113b is situated over a flat bed being alternately formed by the etched raised field-oxide layers 104c and the heavily-doped n$^+$diffusion regions 117a. A plurality of word lines including the patterned sixth conductive layers 120a are formed over a gate-dielectric layer 118 formed on a planarized thick-oxide layer 114b and a hard masking layer including a third masking-dielectric layer 121a and its two sidewall dielectric spacers 112a is used as a mask to etch a word line above the active region.

FIG. 4I(c) shows a cross-sectional view along C–C' direction as indicated in FIG. 4I(a) and is also a cross-sectional view along the elongated control-gate layer 108b of the stack-gate transistors in the gate region. As shown in FIG. 4I(c), an integrated floating-gate layer including a major floating-gate layer 102c formed on the thin tunneling-dielectric layer 101c and two extended floating-gate layers 105c formed separately over a portion of two nearby raised field-oxide layers 104b; an intergate dielectric layer 107b is formed over the plurality of integrated floating-gate layers and the raised field-oxide layers 104b; a third conductive layer 108b acting as an elongated control-gate layer is formed over an intergate dielectric layer 107b; a second dielectric spacer 115b is formed over the third conductive layer 108b to define the control-gate length; a gate-dielectric layer 118 is formed over the second dielectric spacer 115b; a plurality of word lines including the patterned sixth conductive layers 120a are formed over a gate-dielectric layer 118 and a hard masking layer including a third masking dielectric layer 121a and its two sidewall dielectric spacers 122a is used as a mask to etch a word line above the active region.

FIG. 4I(d) shows that a cross-sectional view along D–D' direction as indicated in FIG. 4I(a) and is also a cross-sectional view along the select-gate in a gate region. As shown in FIG. 4I(d), a gate-dielectric layer 118 is formed over a plurality of etched raised field-oxide layers 104c and the semiconductor surface in the plurality of active regions; a plurality of word lines together a plurality of planarized fifth conductive layers 119a are patterned and etched by using a plurality of hard masking layers as a mask, wherein a hard masking layer includes a third masking dielectric layer 121a and its two sidewall dielectric spacers 122a. It is clearly seen that the sidewall dielectric spacer 112a is used to eliminate the misalignment of a word line and its integrated select gate with respect to an active region.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A scalable multi-bit flash memory cell, comprising:
   a semiconductor substrate of a first conductivity type;
   a cell region including an active region and two shallow-trench-isolation (STI) regions being formed on said semiconductor substrate and dividing into three regions: a gate region being formed between a first-side region and a second-side region, wherein said gate region is defined by a masking photoresist step and is therefore scalable;
   a common-diffusion region of a second conductivity type being separately formed in said active region of said first-side region and said second-side region using said gate region as an implantation mask;
   a flat bed being separately formed in said first-side region and said second-side region, wherein said flat bed is formed by said common-diffusion region and etched raised field-oxide layers over said two STI regions;
   a sidewall-oxide spacer being separately formed over each sidewall of said gate region and on a portion of said flat bed;
   a conductive layer acting as a bit line being separately formed over said flat bed outside of said sidewall-oxide spacer;
   a planarized thick-oxide layer being formed over said conductive layer and said sidewall-oxide spacer;
   two stack-gate transistors being separately formed in the side portions of said gate region and one select-gate transistor being formed between said two stack-gate transistors, wherein each of said two stack-gate transistors comprises from top to bottom a sidewall dielectric spacer formed over a sidewall created by said sidewall-oxide spacer and said planarized thick-oxide layer, an elongated control-gate layer over an intergate dielectric layer, and an integrated floating-gate layer;
   wherein said integrated floating-gate layer comprises a major floating-gate layer being formed on a thin tunneling-dielectric layer and two extended floating-gate layers being separately formed on a portion of nearby raised field-oxide layer formed on each of said two STI regions;
   a gate-dielectric layer being formed over a semiconductor surface between said two stack-gate transistors, said two stack-gate transistors and their inner sidewalls, and said planarized thick-oxide layers in said first-side region and said second-side region; and
   a word line being patterned above said active region and transversely to said elongated control-gate layer, wherein said word line comprises from top to bottom a hard masking layer over a metal layer and a planarized conductive island being formed over said gate-dielectric layer and between said two stack-gate transistors.

2. The scalable multi-bit flash memory cell according to claim 1, wherein said common-diffusion region is preferably a lightly-doped diffusion region.

3. The scalable multi-bit flash memory cell according to claim 1, wherein said conductive layer is preferably a heavily-doped polycrystalline-silicon layer of said second conductivity type capped with a refractory-metal silicide layer and said heavily-doped polycrystalline-silicon layer is acted as a dopant diffusion source for forming a heavily-doped common-diffusion region within said common-diffusion region.

4. The scalable multi-bit flash memory cell according to claim 1, wherein said elongated control-gate layer is preferably a polycide-gate layer.

5. The scalable multi-bit flash memory cell according to claim 1, wherein said integrated floating-gate layer is preferably made of doped polycrystalline-silicon or doped amorphous-silicon.

6. The scalable multi-bit flash memory cell according to claim 1, wherein said sidewall dielectric spacer formed is preferably made of silicon-nitrides, silicon-oxynitrides, silicon-oxides, or dielectric materials of low dielectric constant.

7. The scalable multi-bit flash memory cell according to claim 1, wherein said gate-dielectric layer is preferably a silicon-oxide layer or a composite dielectric layer having a nitride-oxide structure or an oxide-nitride-oxide structure.

8. The scalable multi-bit flash memory cell according to claim 1, wherein said planarized conductive island is preferably made of doped polycrystalline-silicon or doped amorphous-silicon capped with a refractory-metal silicide layer.

9. The scalable multi-bit flash memory cell according to claim 1, wherein said planarized conductive island is preferably a planarized metal island over a barrier-metal layer.

10. The scalable multi-bit flash memory cell according to claim 1, wherein said metal layer is preferably a composite layer of an aluminum (Al) layer, a copper (Cu) layer, a tungsten (W) layer, or a tungsten-silicide ($WSi_2$) layer over a barrier-metal layer.

11. The scalable multi-bit flash memory cell according to claim 1, wherein said hard masking layer comprises a masking dielectric layer formed above said active region and two sidewall dielectric spacers formed over the sidewalls of said masking dielectric layer and is preferably made of silicon-nitrides or silicon-oxides.

12. The scalable multi-bit flash memory cell according to claim 1, wherein a surface of said semiconductor substrate between said two stack-gate transistors is preferably implanted to form an implanted region and said implanted region comprises a shallow implanted region for threshold-voltage adjustment and a deep implanted region for forming a punch-through stop.

13. A scalable multi-bit flash memory cell array, comprising:
   a semiconductor substrate of a first conductivity type;
   a plurality of parallel shallow-trench-isolation (STI) regions and a plurality of active-regions being formed on said semiconductor substrate, wherein each of the plurality of parallel STI regions is filled with a raised field-oxide layer;
   a plurality of gate regions being formed alternately on said semiconductor substrate and transversely to the plurality of parallel STI regions, wherein each of the plurality of gate regions is formed between a pair of common bit-line regions and is defined by a masking photoresist step and is therefore scalable;
   a plurality of common-diffusion regions of a second conductivity type being formed in said semiconductor substrate of the plurality of active regions in said common bit-line regions;
   a flat bed being formed in each of said common bit-line regions, wherein said flat bed is formed alternately by the plurality of common-diffusion regions and etched raised field-oxide layers;
   a sidewall-oxide spacer being formed over the sidewalls of each of the plurality of gate regions and on a portion of said flat bed;
   a conductive layer acting as a bit line being formed over said flat bed between a pair of said sidewall-oxide spacers;
   a planarized thick-oxide layer being formed over a pair of said sidewall-oxide spacers and said conductive layer formed therebetween;
   two stack-gate regions being formed in the side portions of each of the plurality of gate regions and one select-gate region being formed between said two stack-gate regions, wherein each of said stack-gate regions comprises from top to bottom a sidewall-dielectric spacer formed over a sidewall created by said sidewall-oxide spacer and said planarized thick-oxide layer, an elongated control-gate layer over an intergate-dielectric layer, a plurality of integrated floating-gate layers formed under said intergate-dielectric layer;
   wherein each of the plurality of integrated floating-gate layers comprises a major floating-gate layer being formed on a thin tunneling-dielectric layer and two extended floating-gate layers being separately formed on a portion of each of nearby two raised field-oxide layers;
   a gate-dielectric layer being formed alternately over a plurality of semiconductor surfaces between said two stack-gate regions, said two stack-gate regions and their inner sidewalls, and said planarized thick-oxide layers; and
   a plurality of word lines being formed above the plurality of active regions and transversely to said elongated control-gate layers, wherein each of the plurality of word lines comprises a hard masking layer over a metal layer and a plurality of planarized conductive islands with each of the plurality of planarized conductive islands being formed over said gate dielectric layer between a pair of said two stack-gate regions.

14. The scalable multi-bit flash memory cell array according to claim 13, wherein said common-diffusion region comprises a lightly-doped diffusion region being formed within a heavily-doped diffusion region.

15. The scalable multi-bit flash memory cell array according to claim 13, wherein said conductive layer is preferably a heavily-doped polycrystalline-silicon layer capped with a refractory-metal silicide layer.

16. The scalable multi-bit flash memory cell array according to claim 13, wherein said planarized conductive island is preferably made of doped-polycrystalline-silicon and is capped with a refractory-metal silicide layer.

17. The scalable multi-bit flash memory cell array according to claim 13, wherein said planarized conductive island is preferably formed by a planarized metal island over a barrier-metal layer and said planarized metal island is preferably made of tungsten-silicide or tungsten.

18. The scalable multi-bit flash memory cell array according to claim 13, wherein said metal layer acting as said word line is preferably an aluminum layer or a copper layer or a tungsten-silicide layer or a tungsten layer formed over a barrier-metal layer.

19. The scalable multi-bit flash memory cell array according to claim 13, wherein said hard masking layer comprises a masking dielectric layer and its two sidewall dielectric spacers and is preferably made of silicon-oxides or silicon-nitrides.

20. The scalable multi-bit flash memory cell array according to claim 17 or claim 18, wherein said barrier-metal layer is preferably made of refractory-metal-nitrides such as titanium-nitride (TiN) or tantalum-nitride (TaN).

* * * * *